United States Patent
Honma et al.

(10) Patent No.: US 7,896,223 B2
(45) Date of Patent: Mar. 1, 2011

(54) SOLDER BALL PRINTING APPARATUS

(75) Inventors: Makoto Honma, Tokyo (JP); Noriaki Mukai, Tokyo (JP); Shinichiro Kawabe, Tokyo (JP); Akio Igarashi, Tokyo (JP); Naoaki Hashimoto, Tokyo (JP)

(73) Assignee: Hitachi Plant Technologies, Ltd., Tokyo (JP)

(*) Notice: Subject to any disclaimer, the term of this patent is extended or adjusted under 35 U.S.C. 154(b) by 0 days.

(21) Appl. No.: 12/543,585

(22) Filed: Aug. 19, 2009

(65) Prior Publication Data

US 2010/0072259 A1   Mar. 25, 2010

(30) Foreign Application Priority Data

Sep. 24, 2008 (JP) .............................. 2008-243680

(51) Int. Cl.
*B23K 31/02* (2006.01)
(52) U.S. Cl. ............. 228/245; 228/248.1; 228/180.22; 438/612; 438/613; 438/614; 438/615
(58) Field of Classification Search ............... 228/245, 228/248.1, 180.22; 438/612–615
See application file for complete search history.

(56) References Cited

U.S. PATENT DOCUMENTS

2007/0130764 A1*  6/2007  Nebashi et al. ............... 29/843

FOREIGN PATENT DOCUMENTS

| JP | 2004-062505 | 2/2004 |
| JP | 2005-343593 | 12/2005 |

* cited by examiner

*Primary Examiner*—Jessica L Ward
*Assistant Examiner*—Erin B Saad
(74) *Attorney, Agent, or Firm*—Antonelli, Terry, Stout & Kraus, LLP.

(57) ABSTRACT

Solder bumps formed on an electrode portion of a semiconductor chip are recently miniaturized, and when printing by using solder balls, the solder balls are also miniaturized. Therefore, it is required to print solder balls for printing with accuracy.

Instead of a conventional squeegee, a solder ball loading member including a plurality of semi-spiral wire rods is provided at a print head portion for printing solder balls, and by pressing the solder ball loading member to a mask surface with a predetermined pressing force, turning forces of the solder balls are added by spaces formed by the wire rods. Accordingly, the solder balls are moderately dispersed, and are squeezed into an opening portion of the mask.

6 Claims, 5 Drawing Sheets

SOLDER BALL PRINTING APPARATUS

BACKGROUND OF THE INVENTION

The present invention relates to an apparatus for printing solder balls on an electrode on a surface of a substrate.

Japanese Patent Application Laid-Open No. 2004-62505 discloses a conventional method of printing solder balls in which solder balls are fed onto a mask (alignment member), and then a sieve having two or more wire rod members which are arranged in a state where their rod centers are nearly aligned is allowed to move in the horizontal direction while pressing the wire rod members by using the sieve in a state where the wire rod members can abut on the solder balls with substantially-horizontal postures, so that the solder balls are fed to an opening portion of a mask surface.

As similar to the above, Japanese Patent Application Laid-Open No. 2005-343593 discloses that by using a sieve including a plurality of wire rod members, the wire rod members are arranged while being closer to the sieve in the vertical and horizontal directions with respect to the moving direction of the sieve.

In the method of using the sieve, a feeding port for feeding the solder balls onto the mask and the sieve having a plurality of wire rod members to squeeze the solder balls into the opening portion of the mask surface are provided, and the wire rod members are arranged so as to abut on the solder balls with horizontal postures. In addition, a ball feeding portion is provided at a right end of the mask, and a sucking port for sucking the solder balls is provided at a left end. That is, the ball feeding portion is configured separately from the sieve. Therefore, a fixed amount of solder balls which is larger than the number of electrodes is weighed to be fed onto the mask surface from the ball feeding portion, and the solder balls are fed to the opening portion of the mask by horizontally moving the sieve. Accordingly, in the case where the opening portions of the mask are continuously provided in the moving direction of the sieve, the opening portions into which the solder balls are not fed are possibly present. In addition, there possibly occurs a case in which a large amount of solder balls are fed to the opening portions, and it is difficult to adjust a feeding amount of solder balls. Further, the above-described documents do not disclose how the wire rod members which are provided at the sieve for the solder balls and whose rod centers are nearly aligned are vertically and horizontally closer to the solder balls. In addition, the wire rod members are allowed to abut on the solder balls with horizontal postures, and there is a possibility of generating defects known as double balls which are caused by squeezing extra solder balls into an opening portion of a mask.

OBJECT AND SUMMARY OF THE INVENTION

An object of the present invention is to solve the above described problems, and to provide a solder ball printing apparatus for feeding minute-sized solder balls to an opening portion of a mask with accuracy.

According to the present invention, there is provided a solder ball printing apparatus including a solder ball feeding head which feeds solder balls, for printing, from an opening portion formed on a mask surface onto a substrate on which a flux is printed on an electrode pad, wherein the solder ball feeding head includes: a solder ball reservoir portion which reserves the solder balls; an object like a sieve which feeds a predetermined amount of solder balls from the solder ball reservoir portion onto the mask surface; a solder ball loading member which is formed of a plurality of semi-spiral-shaped wire rods to feed the solder balls fed from the object like a sieve of the solder ball reservoir portion to the opening portion of the mask surface; and solder ball sweeping members which load the solder balls on the front and rear sides of the solder ball loading member and which are formed of the plurality of semi-spiral-shaped wire rods, on the side where they are brought into contact with the mask surface, to sweep extra solder balls.

DESCRIPTION OF THE EMBODIMENTS

There has been recently proposed a method of printing solder balls on an electrode portion. Especially, the pitch of a print target tends to decrease up to 40 to 150 μm, and solder balls each having a diameter as small as 20 to 100 μm have been used. In view of this, the present invention provides an apparatus capable of printing even small solder balls.

Hereinafter, a preferred embodiment of a printing apparatus and a bump forming method of the present invention will be described with reference to the drawings.

Figure 1:
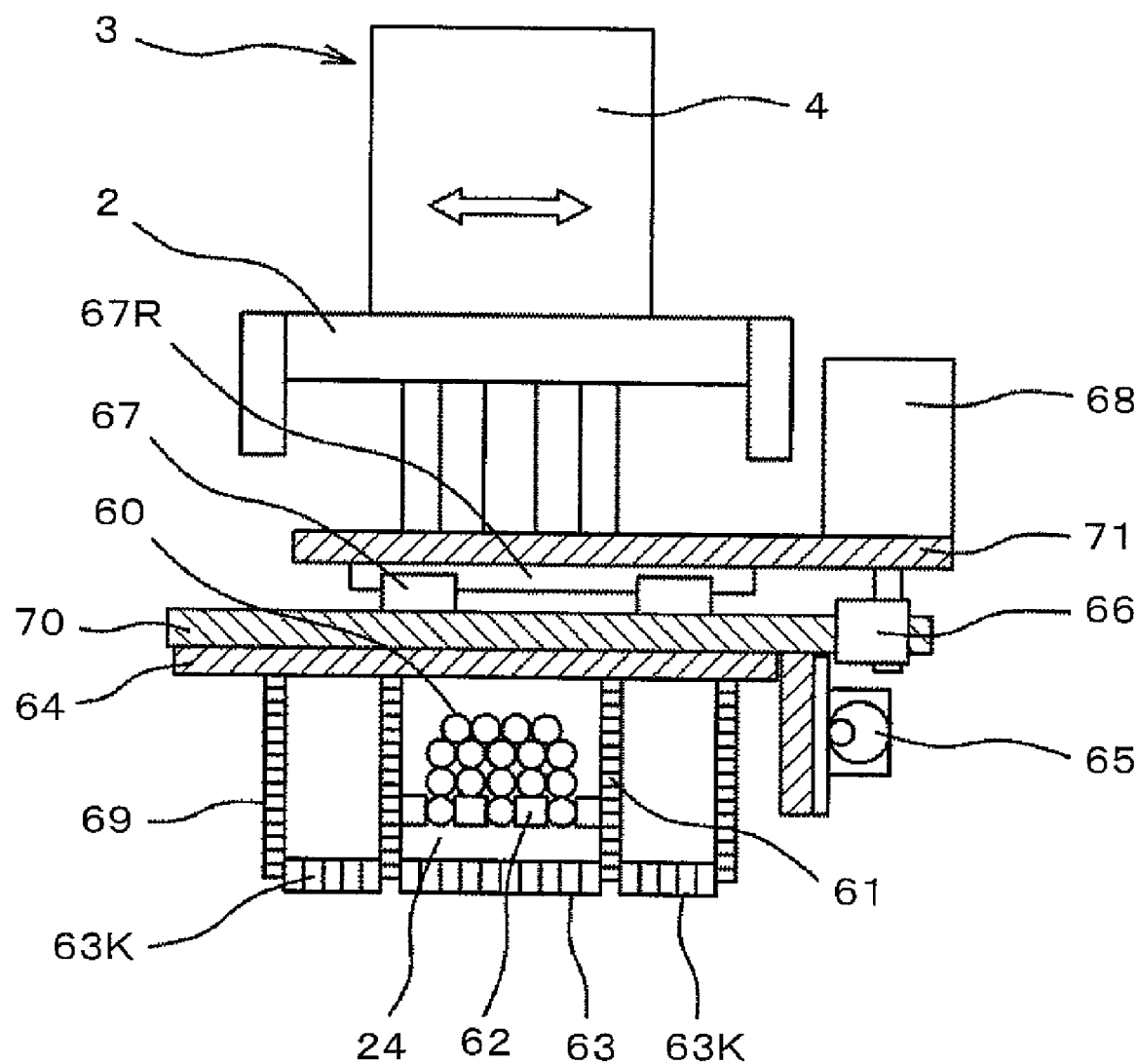
FIG. 1 is a view showing an outline configuration of a solder ball feeding head.

An outline configuration of a solder ball feeding head of a solder ball loading/printing unit is shown in FIG. 1. In FIG. 1, a solder ball feeding head 3 is formed in such a manner that the length in the perpendicular direction with respect to the moving direction where the head moves in the horizontal direction is as large as the width of a mask. A solder ball reservoir portion 60 including a frame object 61 provided at a middle portion and an object 62 like a sieve provided on the lower side of the frame object 61 (on the side opposed to the mask), and a solder ball loading member 63 which is provided on the lower side of the solder ball reservoir portion and which is formed of a plurality of wire rods in a semi-spiral shape (coil shape) served as a squeegee are attached to the frame object 61 by screwing. The object like a sieve is formed of a plurality of wire rod members, and the pitches of the wire rods are changed by oscillating the solder ball reservoir portion so that the solder balls can be shaken down to the lower side. Further, solder ball sweeping members 63K are provided at the front and rear sides of the solder ball loading member in the moving direction of the solder ball feeding head.

Figure 2A:
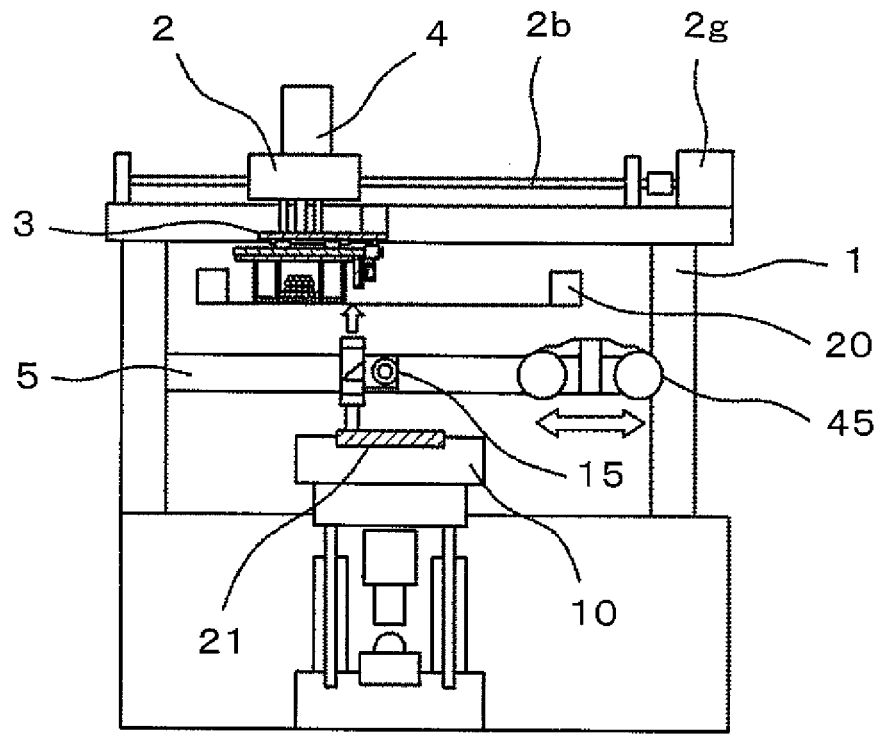
FIG. 2A is a view of an outline configuration of a solder ball printing apparatus.
Figure 2B:
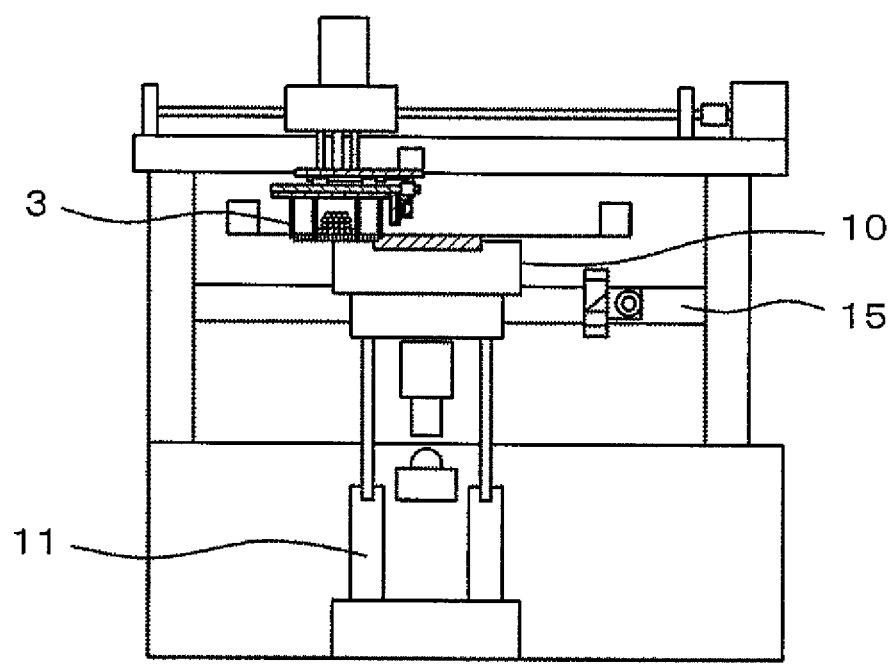
FIG. 2B is a view of an outline configuration of a solder ball printing apparatus.

A cover 64 is provided on the upper side of the frame object 61 of the solder ball reservoir portion 60. The cover 64 is attached to an oscillation frame 70. The oscillation frame 70 is provided with a horizontal-direction oscillator 65 for oscillating in the moving direction of the head with a high frequency (a frequency of about 220 to 250 Hz) and a cam mechanism 66 for enabling a reciprocating motion in the moving direction of the head with a low frequency (a frequency of about 1 to 10 Hz). A slider 67 is provided on the upper side of the oscillation frame 70 so as to move along a linear guide 67R. Further, the linear guide 67R includes, at a head attachment frame 71, a cam shaft driving motor 68 to which the cam 66 is provided. The head attachment frame 71 is attached to a driving shaft of a mechanism 4 for vertically driving the head fixed to a head moving frame 2. By driving the mechanism 4 for vertically driving the head and moving the solder ball feeding head 3 to the mask surface side, the solder ball loading member 63 and the solder ball sweeping members 63K are pressed to the mask surface with a predetermined force. The head moving frame 2 is provided with a frame moving mechanism as shown in FIG. 2A and FIG. 2B, and is configured to allow the solder ball feeding head 3 to move in parallel with respect to the mask surface. When loading the solder balls, the solder ball loading member 63 and the like are pressed to the mask surface while being moved in the horizontal direction, so that the solder balls are fed to an electrode portion on a surface of a substrate surface from an opening portion of the mask.

An outline configuration of the solder ball printing apparatus for printing solder balls is shown in FIG. 2A and FIG. 2B. FIG. 2A shows a state in which a mask is aligned to a substrate, and FIG. 2B shows a state in which solder balls are printed on the substrate.

The solder ball printing apparatus 1 is provided with a vertically-movable print table 10 including a driving unit 11. A substrate is mounted on the print table 10 to align surfaces of a mask 20 and a substrate 21 by using a camera 15. Thereafter, the camera 15 for alignment is returned after being moved on a camera moving frame 5. As shown in FIG. 2B, the mask 20 provided above the table is brought into contact with the surface of the substrate 21, the mechanism 4 for vertically driving the head is driven to vertically move the solder ball feeding head 3, and the solder ball loading member 63 is brought into contact with the mask surface with a predetermined pressing force. Then, by driving a head driving unit 2g, a ball screw 2b is allowed to rotate, so that the solder ball feeding head 3 is moved in the horizontal direction. When the solder ball feeding head 3 is being moved, the solder ball reservoir portion 60 is oscillated by the horizontal-direction oscillator 65, so that the solder balls 24 in the solder ball reservoir portion 60 are shaken down to the solder ball loading member 63 from the object 62 like a sieve. At the same time, the solder balls are loaded in the opening portion provided in the mask 20 by the solder ball loading member 63 provided in the moving direction of the solder ball feeding head 3 across the solder ball reservoir portion 60. Turning forces of the solder balls which are shaken down to the solder ball loading member 63 are generated by the solder ball loading member 63 formed of wired rods in a semi-circular spiral shape along with the movement of the solder ball feeding head 3. Accordingly, the solder balls are squeezed into the opening portion by the action of a downward force at the opening portion of the mask. Further, a cleaning mechanism 45 for cleaning a back surface of the mask is provided at the camera moving frame 5 in the apparatus, so that the cleaning mechanism 45 can be moved in the horizontal direction as similar to the camera 15.

Figure 3A:
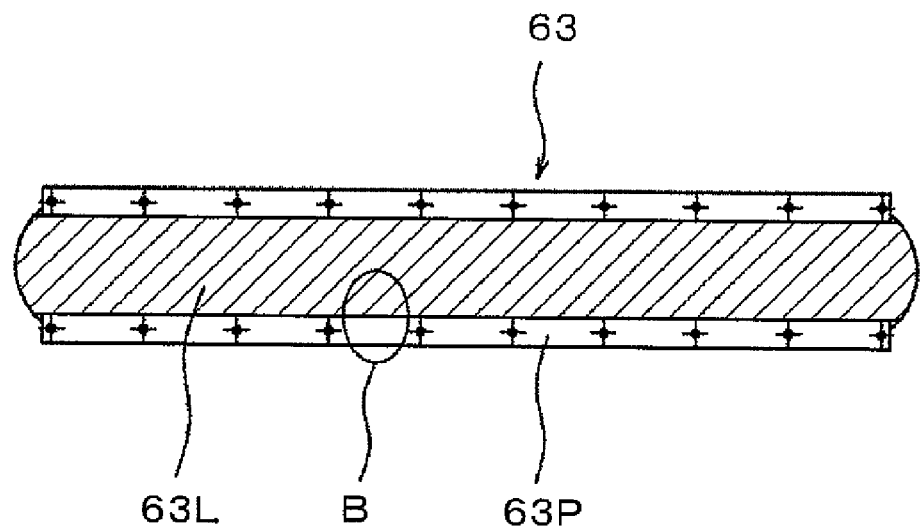
FIG. 3A is a view showing a configuration of a solder ball loading member.
Figure 3B:
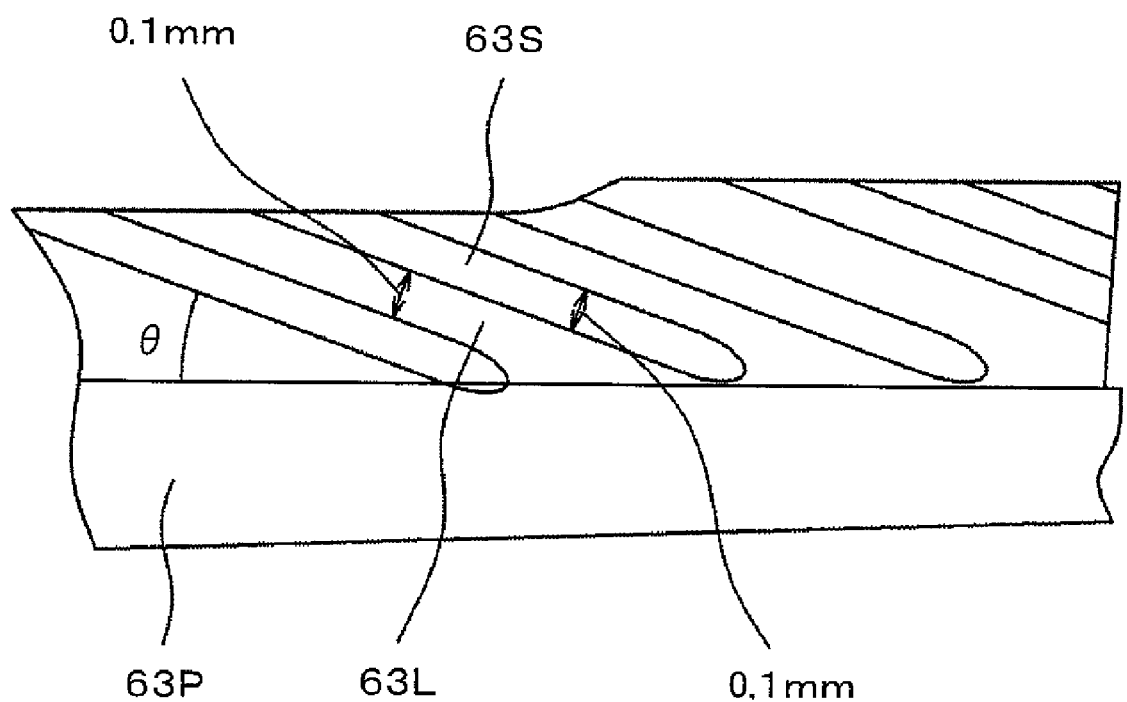
FIG. 3B is a view showing a configuration of a solder ball loading member.

A plan view of the solder ball loading member is shown in FIG. 3A and FIG. 3B. FIG. 3A shows a plan view before the solder ball loading member 63 is attached to the apparatus, and FIG. 3B shows an enlarged view of a portion B in FIG. 3A. As shown in FIGS. 3A and 3B, the solder ball loading member 63 is formed in such a manner that a plurality of wire rods 63L (each having a thickness of 0.1 mm) with predetermined angles (about 5 to 35 degrees) are provided at predetermined intervals 63S (about 0.1 mm) between two attachment portions 63P (each having a width of about 5 mm) provided in parallel at an interval (about 35 mm in the embodiment). That is, the wire rods in the embodiment are provided at the two attachment portions 63P provided at an interval in a state where each rod center is displaced. The angle of each wire rod is preferably about 10 degrees. Each of the attachment portions 63P is formed in such a manner that its longitudinal direction corresponds to the perpendicular direction with respect to the moving direction of the head. That is, each length of the attachment portions 63P corresponds to the width of the head. The solder ball loading member 63 is attached to the frame object 61 of the solder ball reservoir portion 60. That is, when the solder ball loading member 63 is attached, the upper half of the spiral-shaped coil is cut off to be attached in the vertical direction of the solder ball feeding head. Therefore, in the case where the solder ball feeding head is brought into contact with the mask while applying a predetermined pressing force towards the mask side, a plurality of wire rods each having a predetermined angle with respect to the head moving direction are simultaneously moved at the contact area with the mask. It should be noted that the solder ball sweeping members 63K are also configured as similar to the solder ball loading member 63, and are attached between a loading member attachment frame 69 and the frame object 61.

Figure 4:
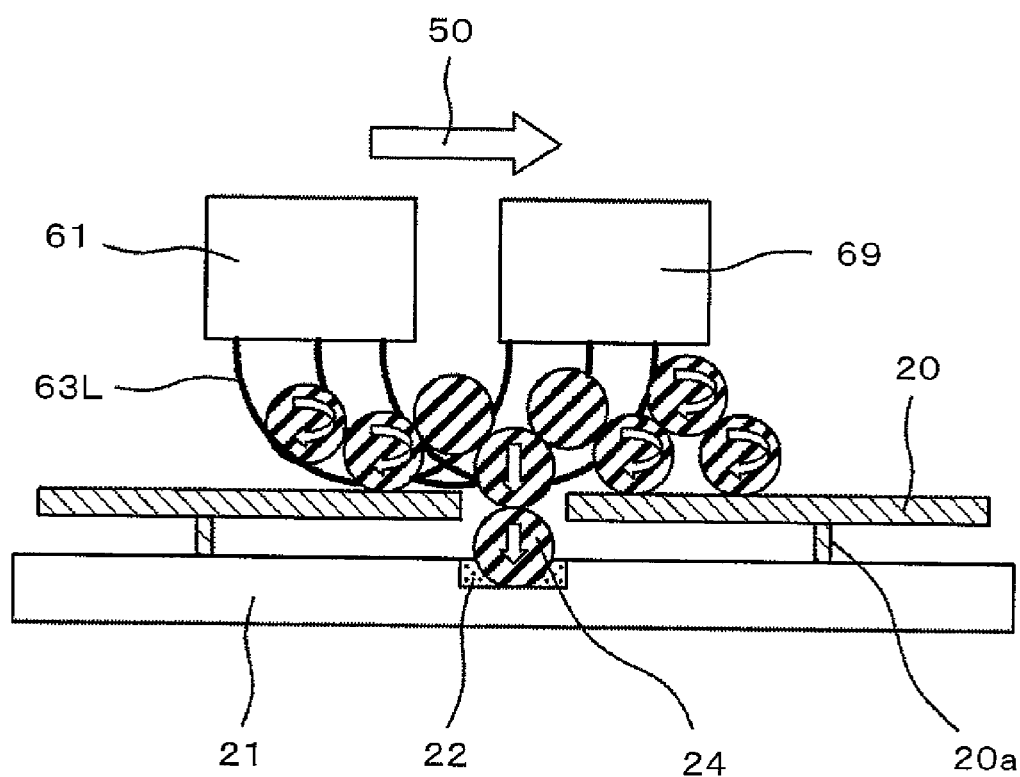
FIG. 4 is a view showing a state of the solder ball loading member in which solder balls are loaded.

An outline view of a state in which solder balls are loaded is shown in FIG. 4. In FIG. 4, a flux 22 is printed in advance on the electrode portion on the substrate 21. In addition, minute protrusions 20a are provided near the opening portion of the mask 20 on the back surface side, so that the mask 20 is not brought into contact with the flux and the like. Instead of the minute protrusions 20a, minute steps may be provided using a film or the like. Further, as shown in FIG. 4, spiral-shaped (semicircular-shaped) spaces formed by the wire rods 63L are present in the vertical direction in the solder ball loading member provided at the solder ball feeding head, and turning forces of the solder balls 24 are generated in the moving direction of the head by the spaces along with the movement of the solder ball feeding head. Accordingly, the solder balls are dispersed and one of the solder balls is fed to one of the opening portions of the mask. It should be noted that the object 62 like a sieve provided at the solder ball reservoir portion 60 is configured as similar to the solder ball loading member 63. However, the interval between the rods is smaller than the diameter of the applied ball by about 5 μm.

Figure 5:
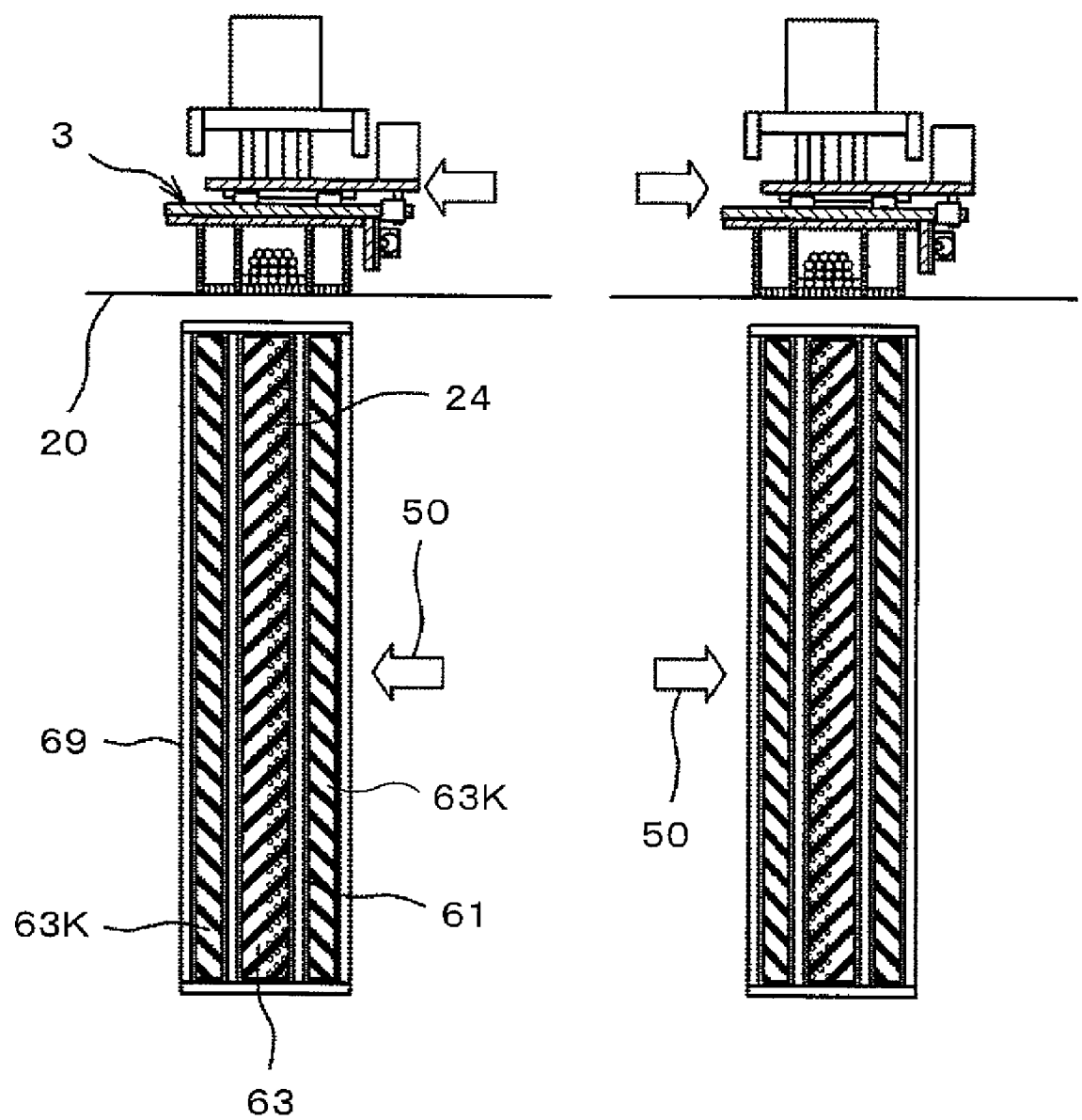
FIG. 5 is a view describing a moving direction of the solder ball feeding head and a state of solder balls.

FIG. 5 shows a state in which the solder balls are collected with respect to the moving direction when the solder ball feeding head is moved.

The direction of the inclination of the spiral is inversed, with the same configuration as the solder ball loading member 63, on the surface side facing the mask surface of the solder ball reservoir portion 60, so that, as shown in FIG. 5, when the solder ball feeding head 3 is moved on the mask surface, the solder balls 24 are collected in accordance with the moving direction, the intervals of the wire rods are changed by the motion of the horizontal-direction oscillator 65, and appropriate quantities of solder balls are fed to the mask surface to be squeezed into the opening surface of the mask by the solder ball loading member located in the middle. Further, the solder ball sweeping member provided on the rear side in the moving direction serves to load the solder balls remaining on the mask surface without being squeezed into the opening portion of the mask by the solder ball loading member in the middle, into the opening portion of the mask as well as to collect the remaining solder balls. As shown in FIG. 5, the direction of each inclination of the wire rods 63L of the solder ball loading member 63 is opposed to that of the wire rods of the solder ball loading member 63 under the solder ball reservoir portion 60.

As an example of a manufacturing method of the object like a sieve and the solder ball loading member, a steel plate with a thickness of 0.05 to 0.1 mm is machined to have a predetermined outside dimension, and then gap portions between the wire rods are etched while leaving the wire rod portions.

Next, a series of operations of solder ball printing will be described.

First, the substrate on which the flux is printed on the electrode portion is conveyed to the solder ball printing apparatus to be mounted on the printing table 10. A plurality of absorption ports for applying a negative pressure are provided at the printing table 10, so that the substrate is maintained so as not to be moved on the surface of the table by applying a negative pressure.

Next, an alignment mark provided on the surface of the substrate and an alignment mark provided on the mask 20 are imaged by using the camera 15 for alignment. Imaged data are transmitted to a control unit (not shown) where the image is processed to obtain the amount of displacement, and on the basis of the result, the print table 10 is moved to the direction where the displacement is corrected by the horizontal-direction moving mechanism (not shown).

When the alignment is completed, the print table is lifted to be brought into contact with the back surface of the mask.

Next, the solder ball feeding head is horizontally moved to a print start position, and is lowered to the mask surface.

The horizontal-direction oscillator 65 and the cam shaft driving motor are driven to feed the solder balls accommodated in the solder ball reservoir portion to the mask surface.

While the solder ball feeding head is moved in the horizontal direction, the solder balls are squeezed into the opening portion of the mask by the solder ball loading member (by spring action of the coil-like wire rods), and are attached to the flux on the substrate.

When the movement of the solder ball feeding head on the mask surface is completed, the solder ball feeding head is lifted so as to be apart from the mask surface, and the solder ball feeding head is returned to its original position.

Next, the print table is lowered so that the mask is apart from the table.

Printing conditions of the printed substrate are imaged by the camera to check presence or absence of defects.

If defects are present, the substrate is conveyed to a repair unit where the defect portions are repaired.

The substrate is conveyed to a reflow unit after the defect portions are repaired, and the solder balls are fixed in a melted state.

The steps of printing the solder balls have been roughly described above. However, the repair unit and the reflow unit are not described in detail because they are different from the above-described apparatus.

During the steps, the solder balls each having a minute diameter can be reliably fed on the flux from the opening portion of the mask by using the solder ball feeding head of the present invention.

Since the solder ball loading member formed of a plurality of wire rods in a semi-spiral shape is provided at the solder ball feeding head on the front and rear sides of the solder ball reservoir portion, turning forces are applied to the solder balls fed by the spaces in the vertical direction configured by the wire rods of the solder ball loading member, the solder balls can be dispersed, and one of the solder balls can be squeezed into one of the opening portions of the mask with accuracy, resulting in improvement of printing accuracy.

The invention claimed is:

1. A solder ball printing apparatus comprising a solder ball feeding head which feeds solder balls, for printing, from an opening portion formed on a mask surface onto a substrate on which a flux is printed on an electrode pad, wherein
the solder ball feeding head includes:
a solder ball reservoir portion which reserves the solder balls;
a sieve which is formed of a first plurality of semi-spiral-shaped wire rods to feed a predetermined amount of solder balls from the solder ball reservoir portion to a solder ball loading member;
the solder ball loading member which is formed of a second plurality of semi-spiral-shaped wire rods located below the first plurality of semi-spiral-shaped wire rods to generate turning forces of the solder balls and to feed the solder balls fed from the sieve of the solder ball reservoir portion to the opening portion of the mask surface;
solder ball sweeping members which load the solder balls on a front side and a rear side of the solder ball loading member and which are formed of the second plurality of semi-spiral-shaped wire rods, on a side where they are brought into contact with the mask surface, to sweep extra solder balls; and
a horizontal-direction oscillator which oscillates the solder ball reservoir portion and the solder ball loading member in a moving direction of the solder ball feeding head with a high frequency, to shake down the solder balls in the solder ball reservoir portion to the solder ball loading member from the sieve.

2. The solder ball printing apparatus according to claim 1, wherein
the solder ball feeding head is provided with cam mechanism which allows the solder ball reservoir portion or the solder ball loading member to reciprocate with a low frequency.

3. The solder ball printing apparatus according to claim 1, wherein a mechanism for vertically driving the head which vertically moves the solder ball feeding head is provided, and the wire rods configuring the solder ball loading member and the solder ball sweeping members are brought into contact with the mask surface with a predetermined angle with respect to the moving direction of the solder ball feeding head by applying a pressing force to press the solder ball loading member and the solder ball sweeping members provided at the solder ball feeding head to the mask surface by using the mechanism for vertically driving the head.

4. The solder ball printing apparatus according to claim 1, wherein the sieve and the solder ball loading member are etched from a steel plate having a thickness of 0.05 to 0.1 mm, to form the wire rods at intervals of 0.1 mm, with widths of 0.1 mm, and with inclination angles of about 5 to 35 degrees except for a loading member attachment portion.

5. The solder ball printing apparatus according to claim 4, wherein the inclination angles of the wire rods of the solder ball loading member provided at the solder ball feeding head are opposed to those of the wire rods of the solder ball sweeping members.

6. The solder ball printing apparatus according to claim 1, wherein
intervals between the wire rods of the sieve are smaller than a diameter of an applied solder ball by about 5 μm.

* * * * *